(12) United States Patent
Ignowski et al.

(10) Patent No.: US 10,490,270 B2
(45) Date of Patent: Nov. 26, 2019

(54) REFERENCE COLUMN SENSING FOR RESISTIVE MEMORY

(71) Applicant: HEWLETT PACKARD ENTERPRISE DEVELOPMENT LP, Houston, TX (US)

(72) Inventors: James S Ignowski, Fort Collins, CO (US); Martin Foltin, Fort Collins, CO (US); Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/768,546

(22) PCT Filed: Oct. 28, 2015

(86) PCT No.: PCT/US2015/057833
§ 371 (c)(1),
(2) Date: Apr. 14, 2018

(87) PCT Pub. No.: WO2017/074358
PCT Pub. Date: May 4, 2017

(65) Prior Publication Data
US 2018/0301187 A1    Oct. 18, 2018

(51) Int. Cl.
*G11C 13/00*    (2006.01)
*G11C 7/02*    (2006.01)
*G11C 7/06*    (2006.01)

(52) U.S. Cl.
CPC ............. *G11C 13/004* (2013.01); *G11C 7/02* (2013.01); *G11C 7/062* (2013.01);
(Continued)

(58) Field of Classification Search
CPC .................. G11C 11/1675; G11C 13/0069
(Continued)

(56) References Cited

U.S. PATENT DOCUMENTS 5,386,388 A * 1/1995 Atwood ................ G11C 16/28
 365/185.2
6,426,907 B1 7/2002 Heonigschmid
(Continued)

OTHER PUBLICATIONS

Maffitt, T.M., et al., Design Considerations for MRAM, Jan. 2006, IBM Journal of Research & Development, vol. 50, No. 1, pp. 25-39.
(Continued)

*Primary Examiner* — Michael T Tran
(74) *Attorney, Agent, or Firm* — Hewlett Packard Enterprise Patent Department

(57) ABSTRACT

A circuit includes a resistive memory cell in a memory array to store a memory state for the resistive memory cell. A reference cell in the memory array stores a reference memory state for the resistive memory cell. A function generator concurrently applies a read voltage to the resistive memory cell and the reference cell via a memory row address. A sensing circuit enables the function generator and monitors a target current received from the resistive memory cell when selected via a memory column address and monitors a reference current received when selected via a reference column address in response to the read voltage applied to the memory row address. A current comparator circuit in the sensing circuit compares a difference between the target current and the reference current to determine the memory state of the resistive memory cell.

10 Claims, 6 Drawing Sheets

(52) U.S. Cl.
CPC .. *G11C 13/0002* (2013.01); *G11C 2013/0045* (2013.01); *G11C 2013/0054* (2013.01); *G11C 2207/063* (2013.01)

(58) Field of Classification Search
USPC .................................................. 365/148, 158
See application file for complete search history.

(56) References Cited

U.S. PATENT DOCUMENTS

| | | | |
|---|---|---|---|
| 7,495,971 B2 | 2/2009 | Egerer | |
| 8,320,166 B2 | 11/2012 | Park et al. | |
| 8,787,070 B2 | 7/2014 | Shimakawa | |
| 9,202,561 B1* | 12/2015 | Park ................... | G11C 13/0038 |
| 2002/0154531 A1 | 10/2002 | Lowrey et al. | |
| 2003/0179602 A1* | 9/2003 | Lee, II ................... | G11C 11/14 |
| | | | 365/158 |
| 2004/0120200 A1* | 6/2004 | Gogl ..................... | G11C 7/067 |
| | | | 365/210.1 |
| 2006/0050584 A1* | 3/2006 | Gogl ..................... | G11C 7/02 |
| | | | 365/207 |
| 2006/0092689 A1* | 5/2006 | Braun ................... | G11C 7/067 |
| | | | 365/158 |
| 2008/0002481 A1* | 1/2008 | Gogl ..................... | G11C 5/02 |
| | | | 365/189.06 |
| 2009/0027952 A1 | 1/2009 | Kang et al. | |
| 2009/0207642 A1* | 8/2009 | Shimano ............... | G11C 8/04 |
| | | | 365/72 |
| 2010/0046302 A1* | 2/2010 | Ogura ................... | G11C 7/04 |
| | | | 365/185.21 |
| 2010/0080041 A1* | 4/2010 | Tonomura ............. | G11C 7/14 |
| | | | 365/148 |
| 2010/0118588 A1 | 5/2010 | Chen et al. | |
| 2011/0080769 A1 | 4/2011 | Chen et al. | |
| 2011/0310657 A1 | 12/2011 | Kim et al. | |
| 2012/0063196 A1* | 3/2012 | Kim ..................... | G11C 13/0004 |
| | | | 365/148 |
| 2012/0147664 A1* | 6/2012 | Rho ..................... | G11C 11/1673 |
| | | | 365/158 |
| 2012/0155146 A1* | 6/2012 | Ueda ................... | G11C 11/1659 |
| | | | 365/148 |
| 2012/0161780 A1* | 6/2012 | Choi .................... | G01R 31/2879 |
| | | | 324/537 |
| 2012/0320657 A1* | 12/2012 | Chung ................. | G11C 11/56 |
| | | | 365/96 |
| 2013/0010528 A1 | 1/2013 | Ramani et al. | |
| 2013/0135919 A1* | 5/2013 | Hamada ............... | G11C 7/14 |
| | | | 365/148 |
| 2013/0258762 A1* | 10/2013 | Chih ..................... | G11C 11/161 |
| | | | 365/158 |
| 2014/0003129 A1* | 1/2014 | Rho ..................... | G11C 13/004 |
| | | | 365/148 |
| 2014/0056054 A1* | 2/2014 | Kim ..................... | G11C 13/0069 |
| | | | 365/148 |
| 2014/0098623 A1* | 4/2014 | Sforzin ................. | G11C 17/16 |
| | | | 365/225.7 |
| 2014/0133211 A1* | 5/2014 | Nazarian ............... | G11C 7/062 |
| | | | 365/145 |
| 2014/0204652 A1 | 7/2014 | Lee et al. | |
| 2014/0241041 A1 | 8/2014 | Lee | |
| 2014/0332752 A1* | 11/2014 | Kouno ................. | G11C 13/0004 |
| | | | 257/5 |
| 2015/0071011 A1* | 3/2015 | Tedrow ................ | G11C 7/062 |
| | | | 365/189.07 |
| 2015/0170726 A1* | 6/2015 | Antonyan ............. | G11C 11/1673 |
| | | | 365/158 |
| 2015/0170730 A1* | 6/2015 | Antonyan ............. | G11C 11/4099 |
| | | | 365/189.07 |
| 2015/0187394 A1* | 7/2015 | Lee ...................... | G11C 7/06 |
| | | | 365/148 |
| 2015/0243352 A1* | 8/2015 | Park .................... | G11C 11/5642 |
| | | | 365/163 |
| 2015/0262626 A1* | 9/2015 | Hatsuda ............... | G11C 5/10 |
| | | | 365/72 |
| 2015/0287475 A1* | 10/2015 | Kim ..................... | G11C 17/18 |
| | | | 365/96 |
| 2015/0357035 A1* | 12/2015 | Kim ..................... | G11C 13/0033 |
| | | | 365/148 |
| 2017/0200496 A1* | 7/2017 | Buchanan ............. | G11C 11/1673 |
| 2017/0206956 A1* | 7/2017 | Foltin .................. | G11C 13/0059 |

OTHER PUBLICATIONS

PCT/ISA/R, International Search Report and Written Opinion, dated Jul. 27, 2016, PCT/US2015/057833, 12 pages.

\* cited by examiner

REFERENCE COLUMN SENSING FOR RESISTIVE MEMORY

BACKGROUND

Resistive random-access memory (RRAM or ReRAM) is a type of non-volatile (NV) random-access (RAM) memory that operates by changing the resistance across a dielectric solid-state material often referred to as a memristor. The dielectric, which is normally insulating, can be made to conduct through a filament or conduction path formed after application of a sufficiently high programming voltage. The conduction path can arise from different mechanisms, including vacancy or metal defect migration, for example. When the filament is formed, it may be RESET (e.g., broken, resulting in high resistance) or SET (e.g., re-formed, resulting in lower resistance) by another voltage. After a memory cell has been programmed to a high or low resistance state representing the logic state of the cell, read voltages (lower than the programming voltage) can be applied to the cell to determine its respective resistance state (e.g., apply a fixed read voltage to the cell and read current from cell to determine resistance state).

DETAILED DESCRIPTION

Figure 1:
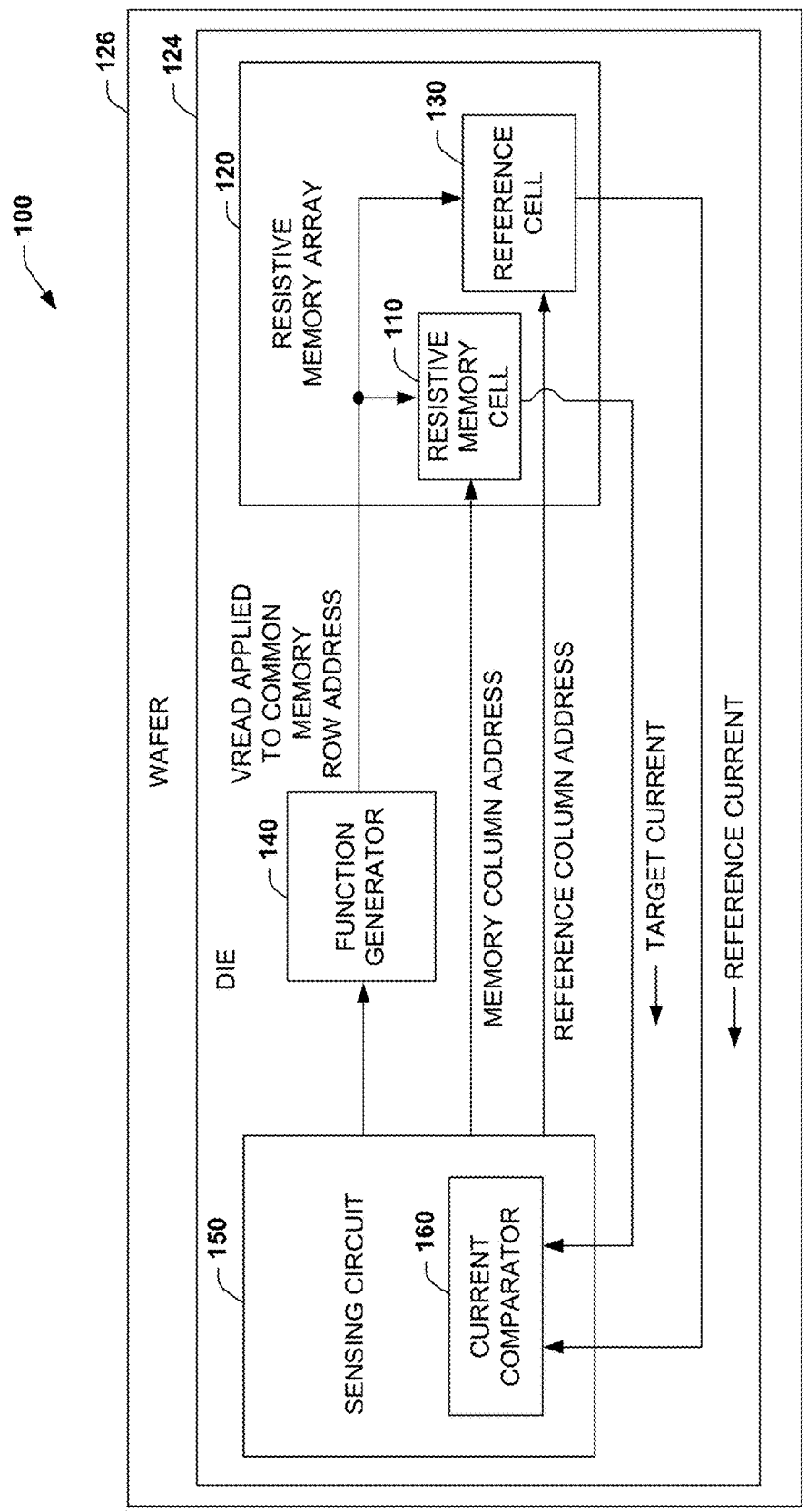
FIG. 1 illustrates an example of a circuit for reading data from a resistive memory cell utilizing reference column addressing of a reference cell.

This disclosure relates to a sensing circuit that operates to more accurately read resistive memory cells in view of process variation across a resistive memory wafer. The resistive memory wafer can include one or more die with each die including one or more memory arrays. Resistive memories store data by programming memory cells in a high resistance state (HRS) or a low resistance state (LRS) depending on a programming voltage applied to set the respective state. After programming, the memory states are then read out via sensing circuits by applying a static or varying voltage to the target memory cell and detecting whether a high or low resistance is present. The memory arrays can have vast parametric discrepancies across the wafer where the amount of current received in the HRS or LRS for a respective memory cell can vary dramatically depending on die location of the target memory cell.

One prior approach to address these parametric issues was to provide local reference cells for each memory cell in the array and compare currents between the respective target memory cell and reference cell when reading the cell to account for parametric differences across the wafer. Currents were first read from the reference cell and stored. Subsequently, currents from the target cell were read and compared with the stored value of the reference cell to determine the state of the memory cell. This was a row-based addressing approach that required additional circuits for accessing and storing the reference cell parameters before a comparison could be made with the memory cell to determine its state. Row-based sensing also required additional time to sense the memory state since two read steps were performed (e.g., store states from target and reference and then compare).

This disclosure utilizes a column-based addressing approach whereby both the reference cell and the target memory cell are stimulated concurrently via common row address lines and read concurrently via separate column address signals. As the reference cell and target memory cell are accessed via a sensing circuit, their respective current outputs are generated concurrently and concurrently compared to determine the state of the target memory cell. Concurrent target/reference current generation along with concurrent comparison operations for sensing memory cell state mitigate the need for sequential storing and comparing which improves access time to the resistive memory. Concurrent sensing operations also simplifies circuit complexity and thus reduces cost. In one example, the comparison includes comparing the target memory cell current output to a predetermined current portion of a reference current output from the reference memory cell that has been preprogrammed into the LRS. By enabling concurrent stimulation and sensing of the reference cell and target memory cell via concurrent column-based addressing of the respective cells, additional storage circuits can be eliminated thus conserving power and reducing circuit complexity. Also, concurrent operations enable faster read access times to the memory cell since sequential storage and sensing operations of row-based approaches are mitigated.

FIG. 1 illustrates an example of a circuit 100 for reading data from a resistive memory cell utilizing reference column addressing of a reference cell. The circuit 100 includes a resistive memory cell 110 in a memory array 120 to store a memory state for the memory array. The memory array 120 (or arrays) can be manufactured as part of a die 124 (or dies). The memory array 120 and die 124 can be located on a wafer 126. The resistive memory cell 110 can be programmed to one of two or more memory states. For example, one memory state can be a low resistance state (LRS) and another memory state can be a high resistance state (HRS). In other examples, resistance in between the LRS and the HRS can be programmed providing the memory cell with the ability to store more than two binary states. The memory state is sensed as a target current from the resistive memory cell 110 that is selected via a memory row address and memory column address in the memory wafer. As used herein, the term memory row address to an input to the memory wafer 120 that selects the row in the wafer (sometimes referred to as a word line) and a voltage source (e.g., function generator 140 in this example) drives the read voltage (e.g., ramp) to stimulate and activate the target and reference cells after they have been selected via the address. Thus, the memory row address can be a digital value (e.g., an 8-bit field) driving an address decoder. The word line ramp voltage can be an analog signal where the address decoder would then select the word line. A reference cell 130 in the memory array 120 stores a reference memory state for the resistive memory cell 110. The reference memory state is sensed as a reference current from the reference cell 130 that is selected via the memory row address and a reference column address in the memory array 120.

A function generator 140 concurrently applies a read voltage VREAD to the resistive memory cell 110 and the reference cell via the common memory row address to the respective cells. The function generator 140 can apply substantially any type of varying signal such as a ramp, saw tooth, or triangle wave, for example. In one example, the function generator can apply a voltage ramp signal to the resistive memory cell 110 and reference cell 130 which can be a linearly varying signal (e.g., linearly increasing signal). By utilizing the ramp voltage to excite the memory cell 110 and reference cell 130 during read operations in contrast to a fixed voltage excitation, the memory bit error rate can be improved in the presence of selector threshold and resistor set and reset voltage variation caused by process variation.

A sensing circuit 150 enables the function generator 140 and monitors the target current received from the resistive memory cell 110 when selected via the memory column address for the resistive memory cell. Concurrently, the sensing circuit 150 monitors the reference current selected via the reference column address of the reference cell 130 in response to the read voltage applied to the memory row address. A current comparator circuit 160 in the sensing circuit compares a difference between the target current and the reference current to determine the memory state of the resistive memory cell 110. The reference current signal is used to stop the output from the function generator 140. This compensates for the selector threshold voltage variation and protects the cells from data alteration due to an accidental high read current. Although a single memory cell 110 and reference cell 130 is described, the memory array 120 can include a plurality of such cells.

Wide variation in the electrical characteristics of resistive memory cells 110 requires memory driving and sensing circuits designed to cover a large operating space. This results in sensing (read) circuits that are complex and/or heavily guard-banded to allow for the variation and resulting poor read margins. However, cell parameter variation is often a function of gross cell location on a given memory die and within any given small region of a die, the variation is much lower. Thus, by placing reference cells 130 regularly across the die, global variation in cell parameters for each region can be mitigated (e.g., only lower local variation is present within a given region if the region is sufficiently small) and memory performance improved. In addition, removal of wide cell parameter variation allows for simpler, lower power sensing circuit topologies than would be required if the sensing circuits 150 had to operate in the presence of full global parameter variation. And in particular, utilizing reference cells 130 in one or more columns of the memory array 120 further enables more efficient sensing circuit topologies.

The selector threshold voltage and memory cell resistance values in low and high resistance states (LRS and HRS, respectively) are key memristor cell electrical parameters for cross-point array structures. These parameters can vary widely across a die (typically in the range of 5 mm to 10 mm on a side), leading to challenges in sensing circuit design. For example, across a die with multiple gigabits of memory cells, selector thresholds may vary by +/−0.4V for a cell with nominal read voltages in the range of 3V. However, locally (in the range of 10 s of um) the variation is much smaller, potentially reduced by an order of magnitude or more. Thus, reference cells 130 placed locally on the memory array 120 allow for providing a reference current that is localized and can be used for comparison with the target current from the resistive memory cell 110.

Due to the conventional hierarchical approach to designing memory chips, where memory cells are organized into small arrays (10 s of um on a side, referred to as MATs for Memristor Array Tiles) which are then placed in repeating patterns across the die, a design structure provides a pre-existing division of cell arrays into small enough areas to exploit the benefit of local versus global parameter variation. While a single sensing circuit may be shared across a large number of MATs, the reference cells 130 can be located in each MAT to allow the sensing circuit 150 to sense the values of cell parameters local to the particular MAT of interest.

Thus, when reading a target memristor cell in an addressed MAT by connecting that cell's row and column lines to the sensing circuit 150, one or more reference cells 130 in that same MAT are also connected to the sensing circuit 150. Both target and reference cells are then subjected to substantially the same read voltage stimulus so their relative performance can be compared. Since selector threshold voltages will be close, both reference and target cells will activate very similarly at the read voltage. Also, the resistance characteristics of the reference and target cells will be very similar.

Figure 2:
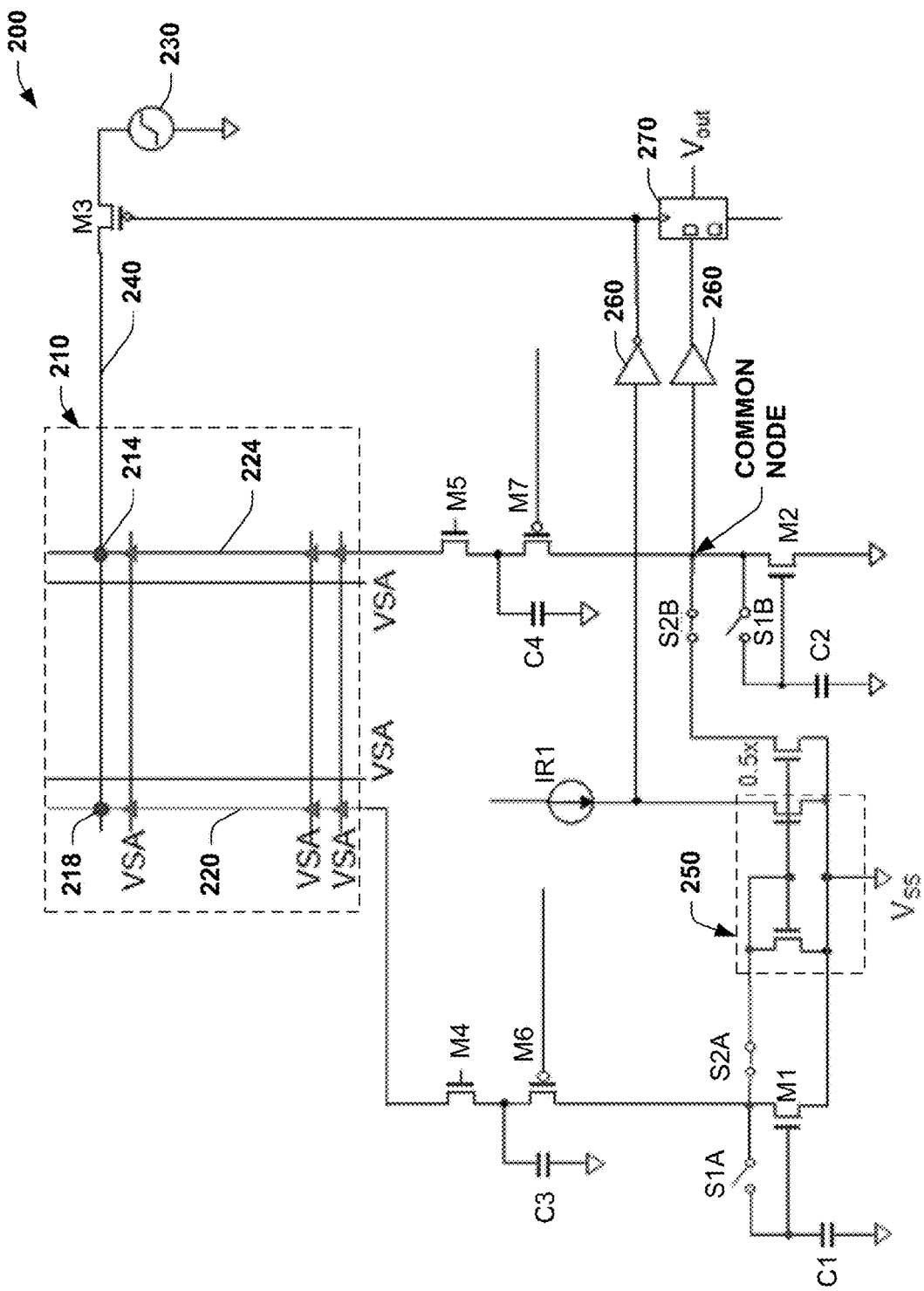
FIG. 2 illustrates an example implementation of a circuit for reading data from a resistive memory cell utilizing reference column addressing of a reference cell.
Figure 4:
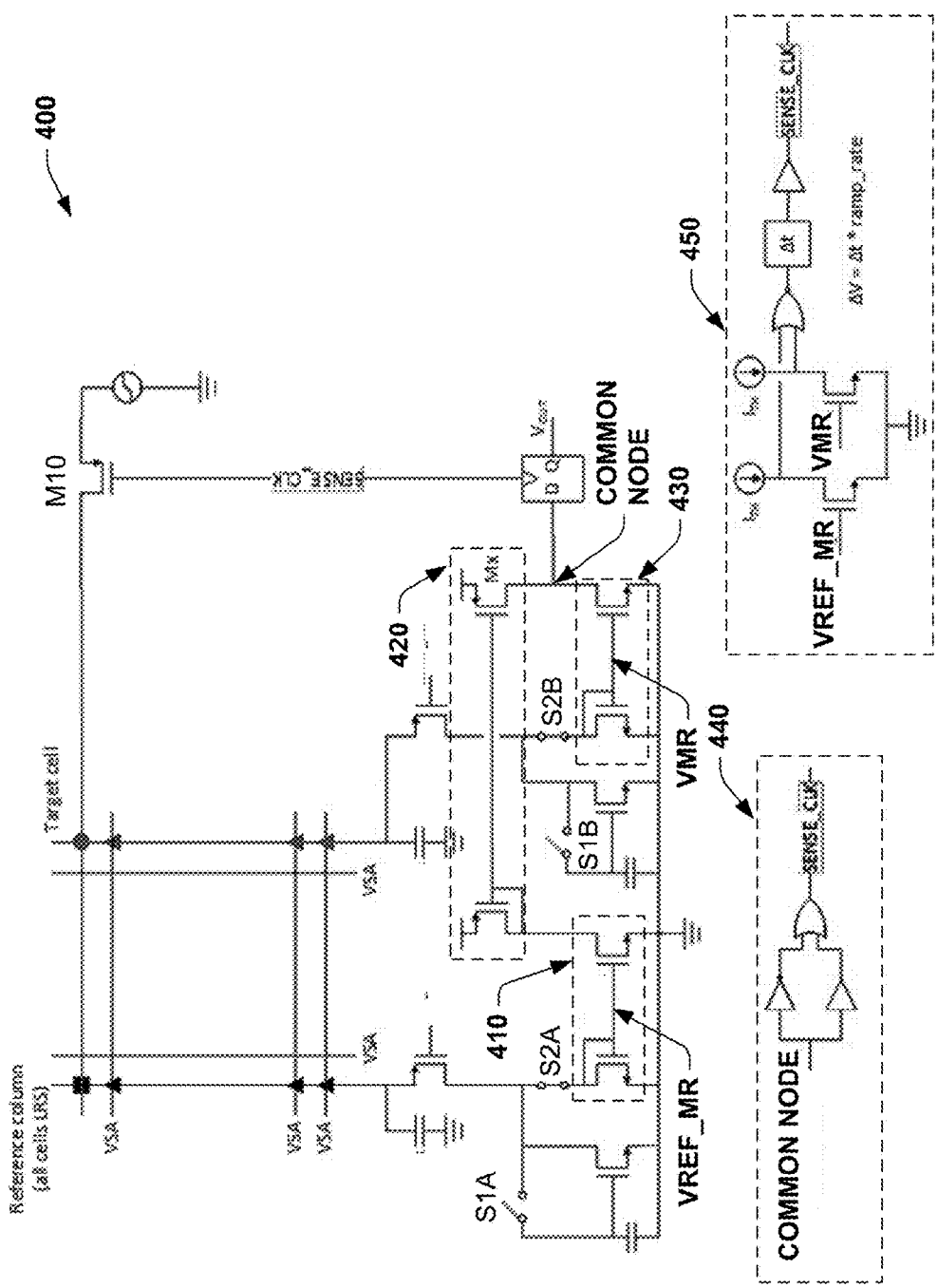
FIG. 4 illustrates an alternative example implementation of a circuit for reading data from a resistive memory cell utilizing reference column addressing of a memory cell.

Various configurations are possible for the current comparator circuit 160 to determine the state of the resistive memory cell 110 (See e.g., FIGS. 2 and 4). For example, the current comparator circuit 160 can include a first current mirror having an output to mirror the reference current from the reference cell 130. The output of the first current mirror can be scaled via a scaling transistor to a threshold current value that is lower than the reference current. The threshold current value can be supplied to a common node in the current comparator circuit 160 which is also driven by the target current. If the target current is above the threshold current value at the common node, the resistive memory cell 110 is sensed as a low resistance state (LRS), if the target current is below the threshold current value at the common node, the resistive memory cell is sensed as a high resistance state (HRS). The scaling transistor can be programmed to a fraction of the reference current value by controlling the size of the scaling transistor. For example, the scaling transistor can be scaled such that that the output of the first current mirror is scaled to about one half of the reference current to provide a noise margin above and below the threshold current value.

In another example configuration, a second current mirror in the current comparator circuit 160 can be provided having an output that mirrors the output from the first current mirror. The output of the second current mirror can also be scaled via a scaling transistor to a threshold current value that is lower than the reference current as mirrored by the first current mirror. When the second current mirror is employed, improved noise sensitivity is provided as will be described in more detail below. The threshold current value is again supplied to a common node in the current comparator circuit 160 driven by the target current. If the target current is above the threshold current value at the common node, the resistive memory cell is sensed as a low resistance state (LRS), and if the target current is below the threshold current value at the common node, the resistive memory cell is sensed as a high resistance state (HRS).

In another example configuration, at least one other reference column can be provided (See e.g., FIG. 5) having at least one reference cell in a high resistance state (HRS)

and at least one reference cell in the low resistance state (LRS). The multiple reference columns are employed to mitigate instances where all of the reference cells are in their LRS states. Having all LRS cells in a single reference column provides a significantly larger total current through the reference column that may give rise to a larger IR drop along the column. This will further change the biasing condition of the cells in the column and become a source of error. By distributing the LRS cells in multiple columns, the total current will be a suitable approximation to the target columns (e.g., assuming that roughly a half of the cells are in LRS and another half in HRS in a target column). The reference cell in the LRS is selected when the read voltage is applied to the reference cell via the memory row address. The sensing circuit 150 can also include a resistive memory cell sample and hold circuit and a reference cell sample and hold circuit to sample the target current and the reference current respectively. Outputs from the respective sample and hold circuits are utilized to offset sneak current paths in the memory array as will be illustrated and described below with respect to FIGS. 2 and 4.

FIG. 2 illustrates an example implementation of a circuit 200 for reading data from a resistive memory cell utilizing reference column addressing of a reference cell. A portion of a memory cell matrix is shown at 210 having a target memory cell 214 and a reference cell 218. The read of the target memory cell 214 can occur in two phases. During a first phase, the target cell's row line voltage is set to VSA (Sense Amp Voltage), the same as the untargeted rows and columns, where VSA is the half-select voltage. At this time, switches SI A and SI B are closed to connect sample and hold capacitors C1 and C2 to their respective nFET drains M1 and M2. Switches S2A and S2B (connecting to other sensing circuits) are opened during the first phase. Sneak current flows through the two diode-connected sample and hold nFETs M1 and M2 and the required gate voltage to replicate the sneak current is stored on the capacitors C1 and C2. This is referred to as a correlated double-sampling technique to subtract sneak current from target cell read current. Since there will be a read signal path through both reference and target columns at 220 and 224, respectively, sneak current is mitigated from both paths. At the conclusion of this first phase, the 51A and 51B switches are opened and their respective nFETs M1 and M2 will continue to sink the sampled sneak current.

During the second phase of the read operation, the S1A and S1B switches remain open and the S2A and S2B switches are closed. The row voltage biasing the target and reference cells is ramped up via function generator and transistor M3. Transistors M4 and M5 select the active target 224 and reference columns 220. Transistors M6 and M7 are bias circuits to maintain a relatively constant voltage across the memristor array during read activity whereas capacitors C3 and C4 represent bit line parasitic capacitance. Since local variation in selector threshold is very low, both the reference and target cell will turn on at about the same time (e.g., at the same value of the voltage ramp from 230). The row line voltage at 240 continues to ramp up and current through both active cells will increase over time, with the reference cell 218 in a predetermined LRS and the target cell 214 in either LRS or HRS, with its value to be determined.

The current through the reference cell 218 is replicated via a current mirror 250 to create a drive contention with current source IR1, where contention refers to current sources that subtract from each other. Source IR1 is an internal reference current with a value less than the lowest possible LRS current from the target cell 214. When the reference cell 218 current increases to the point of being greater than IR1, an inverter 260 output will transition from low to high, triggering a latch 270 and disconnecting the row line voltage ramp via transistor M3. Concurrently, a "0.5×" nFET M8 (or other programmed ratio than 0.5) is generating a current value that is half of the reference cell's LRS current. This creates a drive contention between the 0.5× LRS reference current and the target cell's current at a node shown as common node which functions as part of the current comparator circuit described above with respect to FIG. 1.

If the target cell 214 is in LRS, the latched value (Vout) will be high since the target cell current exceeds the 0.5× LRS current and the common node will be pulled up (e.g., note that reference cell LRS current is very close to target cell LRS current since only local variation is to be accounted for). If the target cell 214 is in HRS, Vout from latch 270 will be low. As shown, buffer 260 provides output voltage level from the common node to the D input of the latch 270. Before proceeding to FIG. 4 to describe an alternative configuration for the current comparator circuit via the common node, a timing diagram is illustrated in FIG. 3 to describe the circuit operation discussed in FIG. 2.

Figure 3:
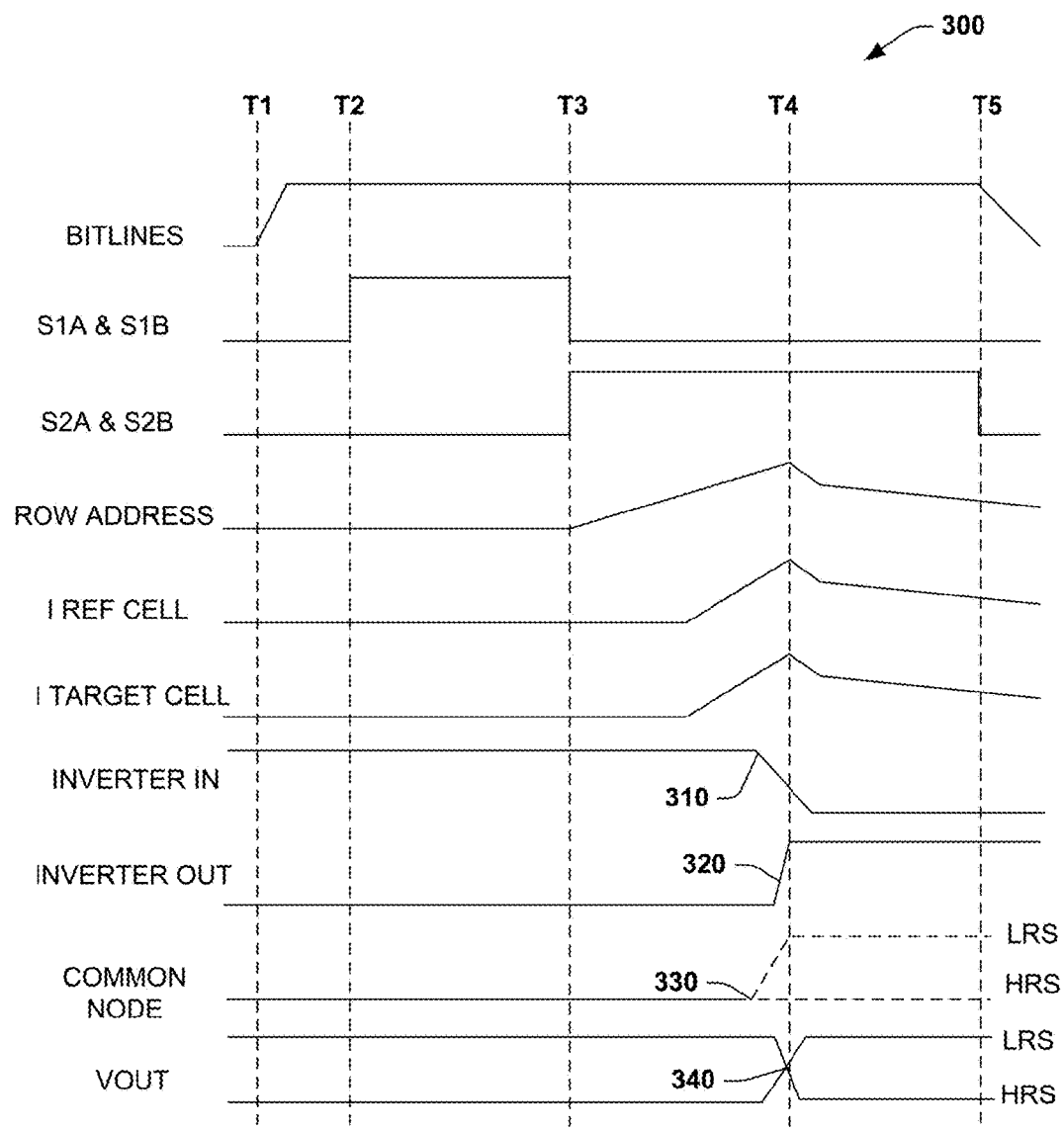
FIG. 3 illustrates an example timing diagram illustrating circuit interactions for the circuit depicted in FIG. 2.

FIG. 3 illustrates an example timing diagram 300 illustrating circuit interactions for the circuit depicted in FIG. 2. Beginning at time T1, bit lines are pre-charged within the resistive memory. At T2 and till time T3, switches S1A and S1B are closed to perform the sneak path reduction on both target and reference columns as previously described. At time T3, S1A and S1B are opened and S2A and S2B are closed. Also, the voltage VSA described above begins to ramp up at T3. The voltage ramp from 230 in FIG. 2 increases from VSA to the voltage required to read these particular cells. On the unselected rows and columns, however, the VSA voltage remains substantially constant at about the midpoint of the voltage drop across the overall array. In this manner, sneak current is almost constant in both the T2-T3 window as well as the T3-T5 window. Thus, VSA is selected initially to minimize overall sneak current. As shown, reference cell current I REF CELL and target cell current I TARGET CELL current begin to ramp up between T3 and T4 and in response to VSA. At 310, the inverter 260 from FIG. 2 has its input begin to traverse downward and its respective output transitions at 320. As shown, the common node transitions high or low at 330 depending on the programmed state of the target cell. Also, the output from the latch is shown transitioning at 340 capturing the respective HRS or LRS from the target memory cell. At time T5, the S2A and S2B switches are opened and the memory read cycle ends.

FIG. 4 illustrates an alternative example implementation of a circuit 400 for reading data from a resistive memory cell utilizing reference column addressing of a memory cell. For purpose of brevity, each component of the circuit 400 is not described due to similarities with the circuit described above with respect to FIG. 2. Similar to FIG. 2 above, the circuit 400 includes a first current mirror 410 having an output to mirror the reference current from the reference cell. A second current mirror 420 has an output at drain node of transistor MX to mirror the output from the first current mirror 410. As shown, the output from MX drives a common node where a current comparison is performed current from the target cell via mirror 430. The output of the second current mirror 420 is scaled via scaling transistor MX to a threshold current value that is lower than the reference current and as mirrored by the first current mirror 410. The threshold current value is supplied to the common node in the current comparator circuit driven by the target current via mirror 430. If the target current is above the threshold current value at the common node, the resistive memory cell is sensed as a low resistance state (LRS). If the target current is below the threshold current value at the common node, the resistive memory cell is sensed as a high resistance state (HRS). A latch 434 and control transistor M10 can be driven via signal sense_clk to store the LRS or HRS, respectively. Two alternative circuit implementations at 440 and 450 can be employed to drive sense_clk.

The circuit 400 provides an advantage of having a much larger voltage swing on the common node that that depicted in FIG. 2, thereby improving noise margin and sensitivity to CMOS process variation at the cost of a slight increase in power and complexity. This circuit 400 also utilizes a programmable scaling factor (M) for the reference cell current rather than the 0.5× used in FIG. 2 but either approach could be employed with either circuit. For the example sensing circuits described herein, the reference cell is set to a predetermined LRS (set). However, similar sensing schemes could also utilize multiple cells (See e.g., FIG. 5). For example, two reference cells, one in LRS and the other in HRS, could be activated during a read, and the average (or weighted average) of the currents they produce could be used to develop a "decision threshold current" to drive contend with the target cell's current in a similar manner to the example circuits described herein (e.g., rather than the 0.5× or M× multiplication factors). This can account for resistance variation in HRS (reset) if that is determined to be a desired parameter to account for.

Figure 5:
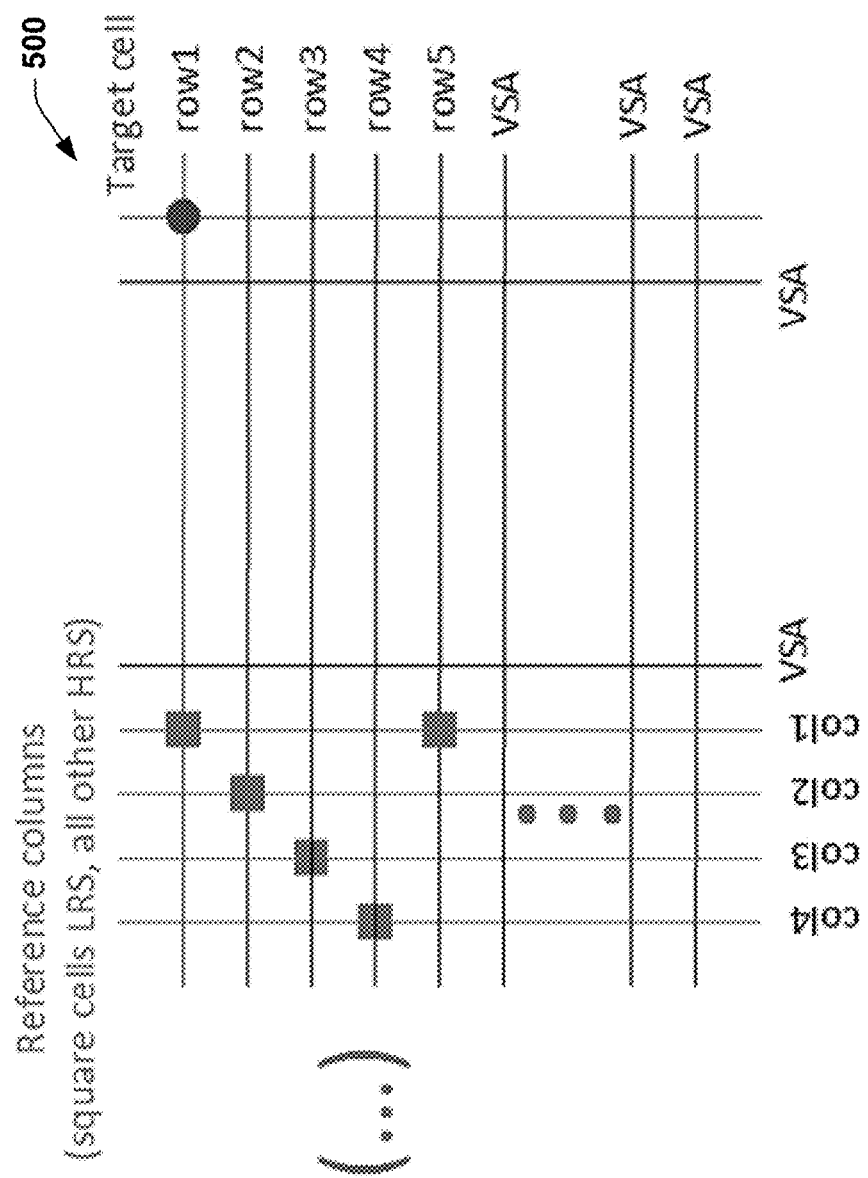
FIG. 5 illustrates an example implementation of a resistive memory cell array utilizing additional reference columns to mitigate sneak current in the array.

FIG. 5 illustrates an example implementation of a resistive memory cell array 500 utilizing additional reference columns to mitigate sneak current in the array. In this aspect, total sneak current can be reduced by having multiple columns of reference cells with each column shown as col1, col2, col3, and col4 having a subset of reference cells set to LRS and the rest of the cells in the respective column set to HRS. This reduces the sneak current contributed by a single reference column. For example every fourth reference cell in a given column can be set to LRS. Thus, when reading the target cell in either row1 or row5 (or others, following the pattern) col1 is used for the reference column (connected to the sensing circuit) and the other reference columns are set to voltage VSA. When reading the target cell in row2, for example, col2 is then used for the reference column as its state is set for LRS and so forth. This can be employed with any number of reference columns, with a tradeoff being increased area for reduced sneak current.

Figure 6:
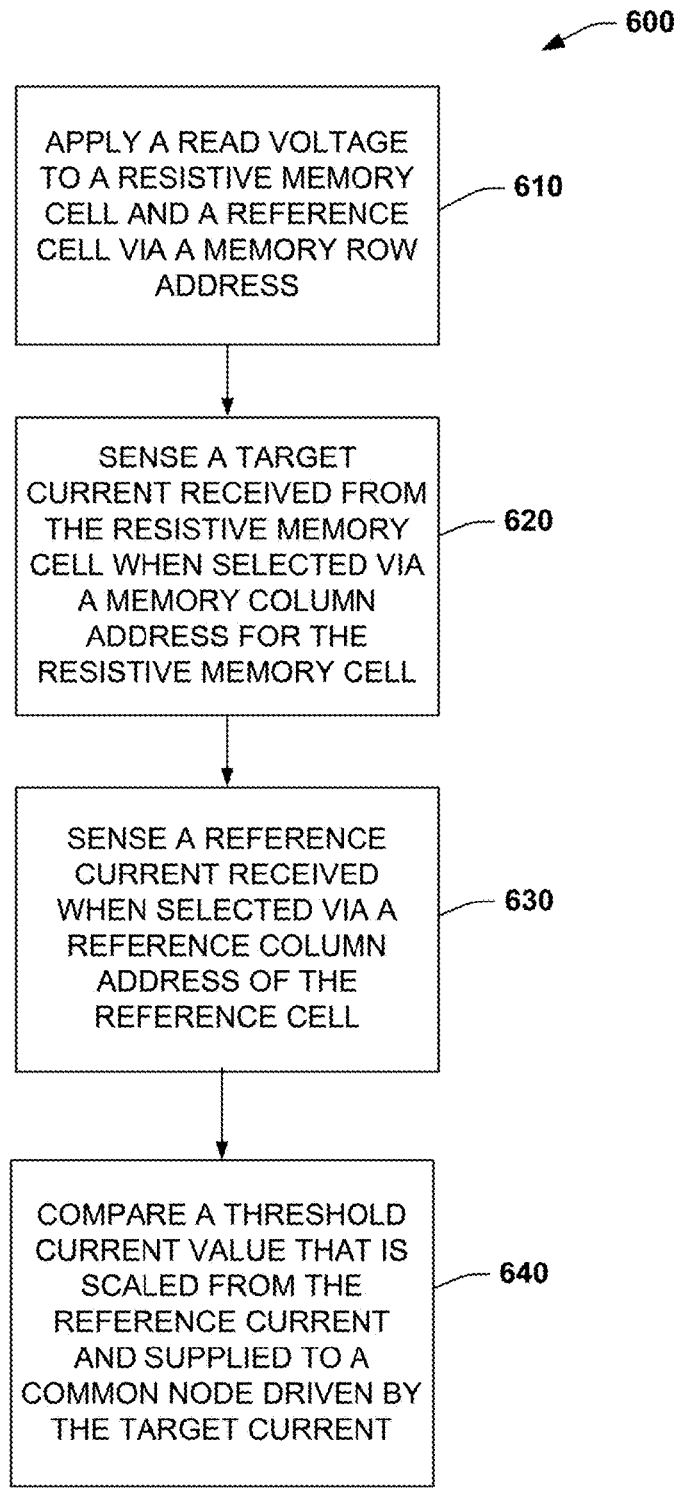
FIG. 6 illustrates an example of a method for reading data from a resistive memory cell utilizing reference column addressing of a reference cell.

In view of the foregoing structural and functional features described above, an example method will be better appreciated with reference to FIG. 6. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components and executed by an integrated circuit, computer, or a controller, for example.

FIG. 6 illustrates an example of a method 600 for reading data from a resistive memory cell utilizing reference column addressing of a reference cell. At 610, the method 600 includes applying a read voltage to a resistive memory cell and a reference cell via a memory row address (e.g., via function generator 140 of FIG. 1). At 610, the method 600 includes sensing a target current received from the resistive memory cell when selected via a memory column address for the resistive memory cell in response to the read voltage applied to the memory row address (e.g., via sensing circuit 150 of FIG. 1). At 630, the method 600 includes sensing a reference current received when selected via a reference column address of the reference cell in response to the read voltage applied to the memory row address (e.g., via sensing circuit 150 of FIG. 1). At 640, the method 600 includes comparing a threshold current value that is scaled from the reference current and supplied to a common node driven by the target current (e.g., via current comparator 160 of FIG. 1). If the target current is above the threshold current value at the common node, the resistive memory cell is sensed as a low resistance state (LRS). If the target current is below the threshold current value at the common node, the resistive memory cell is sensed as a high resistance state (HRS). The method 600 can also include monitoring at least one other reference column for the resistive memory cell, the at least one other reference column having at least one reference cell in a high resistance state (HRS) and at least one reference cell in the low resistance state (LRS), wherein the difference between the HRS and the LRS mitigates sneak currents in the memory array.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A circuit, comprising:
a resistive memory cell in a memory array to store a memory state for the resistive memory cell, the memory state sensed as a target current from the resistive memory cell that is selected via a memory row address and memory column address in the memory array;
a reference cell in the memory array to store a reference memory state for the resistive memory cell, the reference memory state sensed as a reference current from the reference cell that is selected via the memory row address and a reference column address in the memory array,
a function generator to concurrently apply a read voltage to the resistive memory cell and the reference cell via the memory row address;
a sensing circuit to enable the function generator and to monitor the target current received from the resistive memory cell when selected via the memory column address for the resistive memory cell and to monitor the reference current received when selected via the reference column address of the reference cell in response to the read voltage applied to the memory row address; and
a current comparator circuit in the sensing circuit to compare a difference between the target current and the reference current to determine the memory state of the resistive memory cell, the current comparator circuit comprising a first current mirror having an output to mirror the reference current from the reference cell;

wherein the output of the first current mirror is scaled via a scaling transistor to a threshold current value that is lower than the reference current, the threshold current value is supplied to a common node in the current comparator circuit driven by the target current, if the target current is above the threshold current value at the common node, the resistive memory cell is sensed as a low resistance state (LRS), if the target current is below the threshold current value at the common node, the resistive memory cell is sensed as a high resistance state (HRS).

2. The circuit of claim 1, wherein the scaling transistor is programmed to a fraction of the reference current value by controlling the size of the scaling transistor.

3. The circuit of claim 2, wherein the scaling transistor is scaled such that that the output of the first current mirror is scaled to about one half of the reference current to provide a noise margin above and below the threshold current value.

4. The circuit of claim 1, further comprising a second current mirror having an output to mirror the output from the first current mirror, wherein the output of the second current mirror is scaled via a scaling transistor to a threshold current value that is lower than the reference current as mirrored by the first current mirror, the threshold current value is supplied to a common node in the current comparator circuit driven by the target current, if the target current is above the threshold current value at the common node, the resistive memory cell is sensed as a low resistance state (LRS), if the target current is below the threshold current value at the common node, the resistive memory cell is sensed as a high resistance state (HRS).

5. The circuit of claim 1, further comprising at least one other reference column having at least one reference cell in a high resistance state (HRS) and at least one reference cell in the low resistance state (LRS).

6. The circuit of claim 5, wherein the reference cell in the LRS is selected when the read voltage is applied to the reference cell via the memory row address.

7. The circuit of claim 1, further comprising a resistive memory cell sample and hold circuit and a reference cell sample and hold circuit to sample the target current and the reference current respectively, wherein outputs from the respective sample and hold circuits are utilized to offset sneak current paths when the resistive memory cell and the reference cell are accessed.

8. A circuit, comprising:
a function generator to concurrently apply a read voltage to a resistive memory cell and a reference cell via a memory row address;
a sensing circuit to enable the function generator and to monitor a target current received from the resistive memory cell when selected via a memory column address for the resistive memory cell and to monitor a reference current received when selected via a reference column address of the reference cell in response to the read voltage applied to the memory row address;
a current comparator circuit in the sensing circuit that compares a threshold current value that is scaled from the reference current and supplied to a common node driven by the target current, if the target current is above the threshold current value at the common node, the resistive memory cell is sensed as a low resistance state (LRS), if the target current is below the threshold current value at the common node, the resistive memory cell is sensed as a high resistance state (HRS); and
a resistive memory cell sample and hold circuit and a reference cell sample and hold circuit to sample the target current and the reference current respectively, wherein outputs from the respective sample and hold circuits are utilized to offset sneak current paths in the memory array.

9. The circuit of claim 8, further comprising at least one other reference column having at least one reference cell in a high resistance state (HRS) and at least one reference cell in the low resistance state (LRS).

10. The circuit of claim 9, wherein the reference cell in the LRS is selected when the read voltage is applied to the reference cell via the memory row address.

* * * * *